(12) United States Patent
Yui

(10) Patent No.: US 6,593,686 B1
(45) Date of Patent: Jul. 15, 2003

(54) ELECTRON GUN AND ELECTRON BEAM DRAWING APPARATUS USING THE SAME

(75) Inventor: Yoshikiyo Yui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/537,686

(22) Filed: Mar. 29, 2000

(30) Foreign Application Priority Data

Mar. 30, 1999 (JP) .......................................... 11-088948

(51) Int. Cl.⁷ ................................................. H01J 29/46
(52) U.S. Cl. ....................... 313/449; 313/413; 313/336; 250/492.23; 250/492.22
(58) Field of Search ................................. 313/449, 448, 313/413, 336, 421; 250/492.23, 492.2, 492.22

(56) References Cited

U.S. PATENT DOCUMENTS

5,854,490 A  12/1998 Ooaeh et al. ............ 250/492.2
5,872,366 A  2/1999 Ooaeh et al. ............ 250/492.2
5,949,078 A  9/1999 Ooaeh et al. ............ 250/492.2

*Primary Examiner*—Sandra O'Shea
*Assistant Examiner*—Guiyoung Lee
(74) *Attorney, Agent, or Firm*—Fitzpatrick, Cella, Harper & Scinto (57) ABSTRACT

An electron gun according to this invention includes a cathode having a hemispherical electron-emitting surface, an anode which is arranged to face the cathode, and has a first aperture on the optical axis, and a bias electrode which is arranged between the anode and the cathode, receives a potential lower than one applied to the cathode, and has a second aperture larger than the electron-emitting surface of the cathode on the optical axis. The distal end of the electron-emitting surface of the cathode is arranged in contact with or outside a sphere whose diameter is equal to the diameter of the second aperture of the bias electrode.

17 Claims, 7 Drawing Sheets

ELECTRON GUN AND ELECTRON BEAM DRAWING APPARATUS USING THE SAME

FIELD OF THE INVENTION

The present invention relates to an electron gun and an electron beam drawing apparatus using the same and, more particularly, to an electron gun preferably used in a multi-electron beam drawing apparatus capable of realizing high throughput and high precision in the lithography process of a semiconductor device such as a DRAM having a memory capacity of 4 Gbits or more, and an electron beam drawing apparatus using the same.

BACKGROUND OF THE INVENTION

An electron beam drawing apparatus has conventionally been used to form a mask as an original for a semiconductor device such as a DRAM or MPU. Because of high resolution, such electron beam drawing apparatus is recently applied to an exposure apparatus used in a lithography process among semiconductor manufacturing processes in which the devices are being downsized.

At present, so-called direct drawing type electron beam exposure apparatuses have been developed as apparatuses applicable to design rules for a 4-Gbit DRAM and subsequent DRAMs. This type of electron beam exposure apparatus draws a pattern on a semiconductor substrate by converging an electron beam emitted by an electron gun and controlling the focal position by a deflector, electromagnetic lens, and the like.

However, several problems arise when these apparatuses are applied to the semiconductor device mass production process. The most serious problem is the drawing speed, and these apparatuses must achieve drawing speed as high as several ten to several hundred times of speed of the conventional apparatus to obtain the same throughput of a so-called mask drawing apparatus.

One means for solving this problem is multi-beam type electron beam drawing apparatuses of splitting an electron beam emitted by an electron gun into a plurality of beams, e.g., several thousand beams, arranging them in a matrix, and simultaneously drawing a pattern with the respective electron beams. These apparatuses simultaneously draw a pattern on a wide field of view with a plurality of electron beams, and thus can greatly increase the throughput.

Since a pattern is directly drawn by split electron beams, the luminance must be high to a certain degree as a characteristic required for the electron gun of such apparatus which directly draws a pattern on a substrate using a plurality of electron beams having the same beam intensity over a wider field of view. In addition, since one electron beam is split into a plurality of electron beams over a wide field of view, the angle vs. current distribution of the beam intensity must be flat, and the emittance must be high.

In general, the luminance and emittance are conserved quantities, and their values are determined by the electron gun serving as a light source.

An electron gun used in a conventional electron beam drawing apparatus is basically constituted by a cathode having a projecting or sharpened distal end in order to increase the luminance, a Wehnelt cathode for receiving a potential lower than a voltage applied to the cathode and converging electrons emitted by the cathode, and an anode to which a ground potential is applied.

Figure 4:
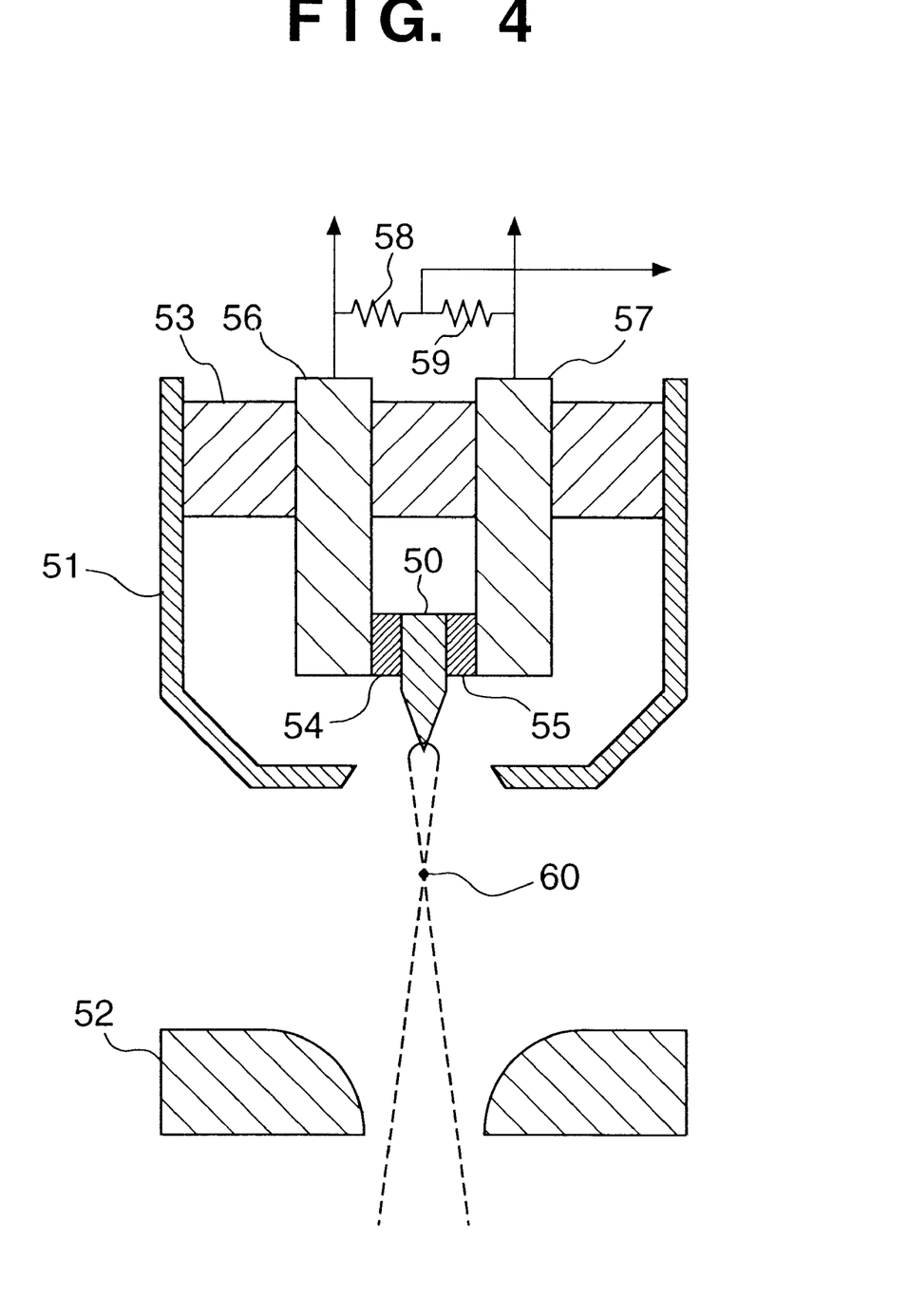
FIG. 4 is a sectional view showing the structure of the main part of a conventional electron gun.

The triode type electron gun has a simple structure and high operability, and thus is generally widely used. FIG. 4 is a sectional view showing the schematic structure of the main part of a conventional electron gun having a triode structure.

The electron gun in FIG. 4 has a triode coaxial structure made up of a cathode 50 serving as an electron source, Wehnelt cathode 51, and anode 52, and comprises an insulator 53, support electrodes 56 and 57, and heaters 54 and 55. The distal end of the cathode 50 is sharp in order to concentrate an electric field on a small region, and has a radius of curvature of about 50 to 100 $\mu$m.

The cathode 50 is heated by so-called energization heating of flowing a current through the heaters 54 and 55 via the support electrodes 56 and 57. In order to accelerate electrons emitted by the cathode 50 to a predetermined energy, the anode 52 receives a voltage higher than the cathode potential by about 10 to 50 kV.

In practice, the anode 52 is grounded, so that a high negative voltage is applied to the support electrodes 56 and 57 of the cathode 50 via bias resistors 58 and 59. The potential of the Wehnelt cathode 51 is much lower than the cathode potential by about 100 to 1,000 V. This potential limits an electron current emitted by the cathode 50, and the Wehnelt cathode 51 operates as a lens having a convergent effect to form a crossover 60.

Figure 5:
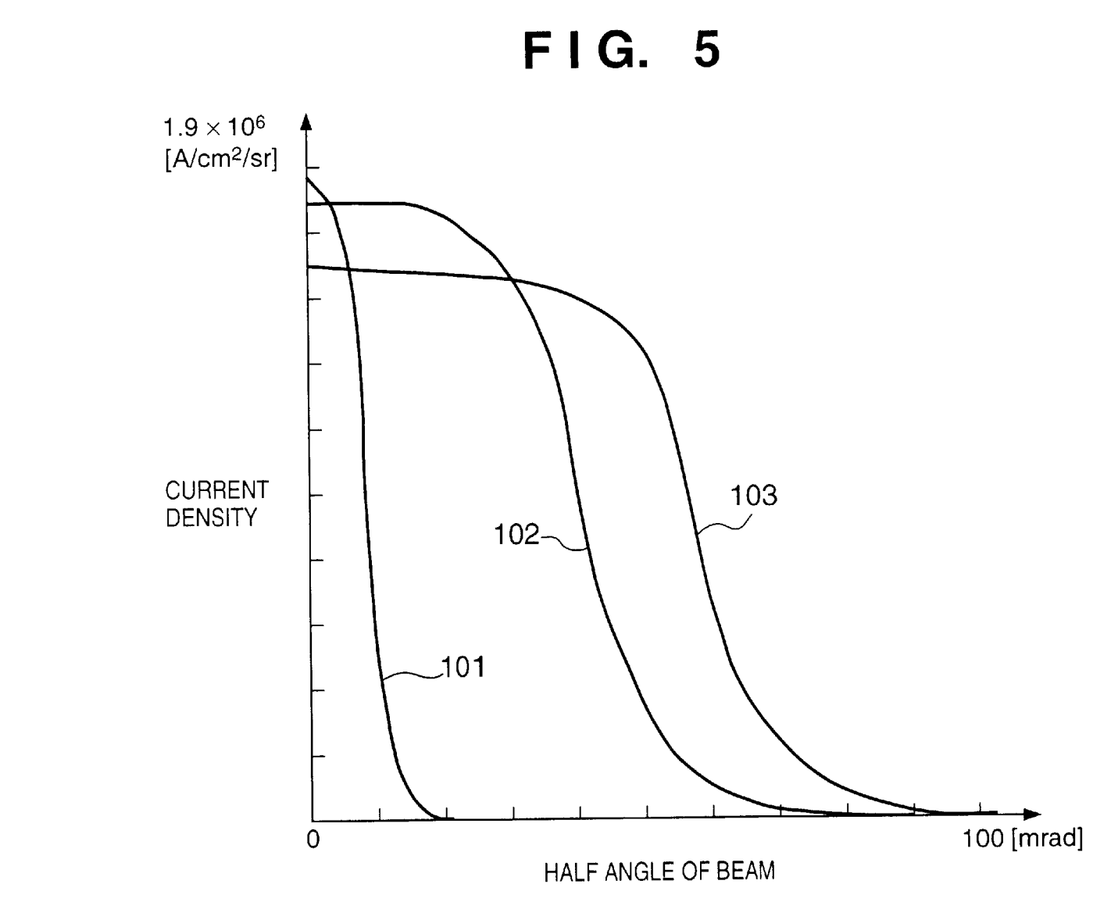
FIG. 5 is a graph showing the angle vs. current distributions of the conventional electron gun and the electron gun of the first embodiment of the present invention in comparison with each other.

FIG. 5 shows an angle vs. current distribution 101 of this electron gun. In this example, the current density is about $2 \times 10^6$, and the crossover radius is about 5 $\mu$m.

In general, the luminance and emittance of this electron gun are up to $10\ ^6 \text{A/cm}^2/\text{str}$ and up to 50 $\mu$m·mrad, respectively.

In the conventional electron gun, the emittance decreases as the luminance increases, and the luminance decreases as the emittance increases. The emittance cannot be increased, while the luminance is kept high to a given degree.

SUMMARY OF THE INVENTION

The present invention has been made to overcome the conventional drawbacks, and has as its object to provide an electron gun capable of emitting an electron beam with a flat angle vs. current distribution and a uniform intensity distribution over a wide field of view while keeping relatively high luminance, and to provide various electron beam application apparatuses using the electron gun and, more particularly, an electron beam drawing apparatus having high throughput.

To achieve the above object, an electron gun according to the present invention comprises a cathode having a hemispherical electron-emitting surface, an anode which is arranged to face the cathode, and has a first aperture on an optical axis, and a bias electrode which is arranged between the anode and the cathode, and has on the optical axis a second aperture having a radius larger than a radius of the electron-emitting surface of the cathode, wherein a distal end of the electron-emitting surface of the cathode is arranged in contact with or outside a virtual sphere whose diameter is equal to the diameter of the second aperture of the bias electrode.

In this manner, according to the present invention, electrons are emitted by the hemispherical electron-emitting surface, and the cathode is arranged on or outside the sphere whose diameter is equal to the inner diameter of the bias electrode. Accordingly, the present invention can provide an electron gun which forms an electrostatic lens exhibiting a flat angle vs. current distribution on a crossover, and has high luminance and high emittance.

The diameter of the second aperture of the bias electrode may be set twice the diameter of the hemispherical electron-emitting surface of the cathode, and electrons may be emitted by the entire hemispherical surface to increase the electron beam intensity.

The radius of the first aperture of the anode may be set smaller than that of the second aperture of the bias electrode to weaken the effect of a concave lens formed by the second aperture and prevent divergence of an electron beam.

A portion of the anode facing the bias electrode may project toward the electron-emitting surface of the cathode to increase the power of an electrostatic lens formed by the bias electrode. Consequently, the present invention can provide an electron gun having a flatter angle vs. current distribution.

An electron beam drawing apparatus according to the present invention comprises an electron gun, a substrate stage, and a projection system arranged between the electron gun and the substrate stage, the electron gun having a cathode having a hemispherical electron-emitting surface, an anode which is arranged to face the cathode, and has a first aperture on an optical axis, and a bias electrode which is arranged between the anode and the cathode, and has on the optical axis a second aperture having a radius larger than a radius of the electron-emitting surface of the cathode, wherein a distal end of the electron-emitting surface of the cathode is arranged in contact with or outside a virtual sphere whose diameter is equal to the diameter of the second aperture of the bias electrode.

In this way, the electron gun having high luminance and high emittance can be applied to various electron beam application apparatuses.

A device manufacturing method according to the present invention comprises the steps of applying a photosensitive agent to a substrate, drawing a pattern on the substrate by a charged-particle beam drawing apparatus, and performing developing processing to the substrate, wherein the charged-particle beam drawing apparatus is an electron beam drawing apparatus having an electron gun, a substrate stage, and a projection system arranged between the electron gun and the substrate stage, the electron gun having a cathode having a hemispherical electron-emitting surface, an anode which is arranged to face the cathode, and has a first aperture on an optical axis, and a bias electrode which is arranged between the anode and the cathode, and has on the optical axis a second aperture having a radius larger than a radius of the electron-emitting surface of the cathode, and a distal end of the electron-emitting surface of the cathode is arranged in contact with or outside a virtual sphere whose diameter is equal to the diameter of the second aperture of the bias electrode.

Further objects, features and advantages of the present invention will become apparent from the following detailed description of embodiments of the present invention with reference to the accompanying drawings.

DETAILED DESCRIPTION OF THE PREFERRED EMBODIMENTS

Preferred embodiments of the present invention will be described in detail below with reference to the accompanying drawings.

First Embodiment

Figure 1:
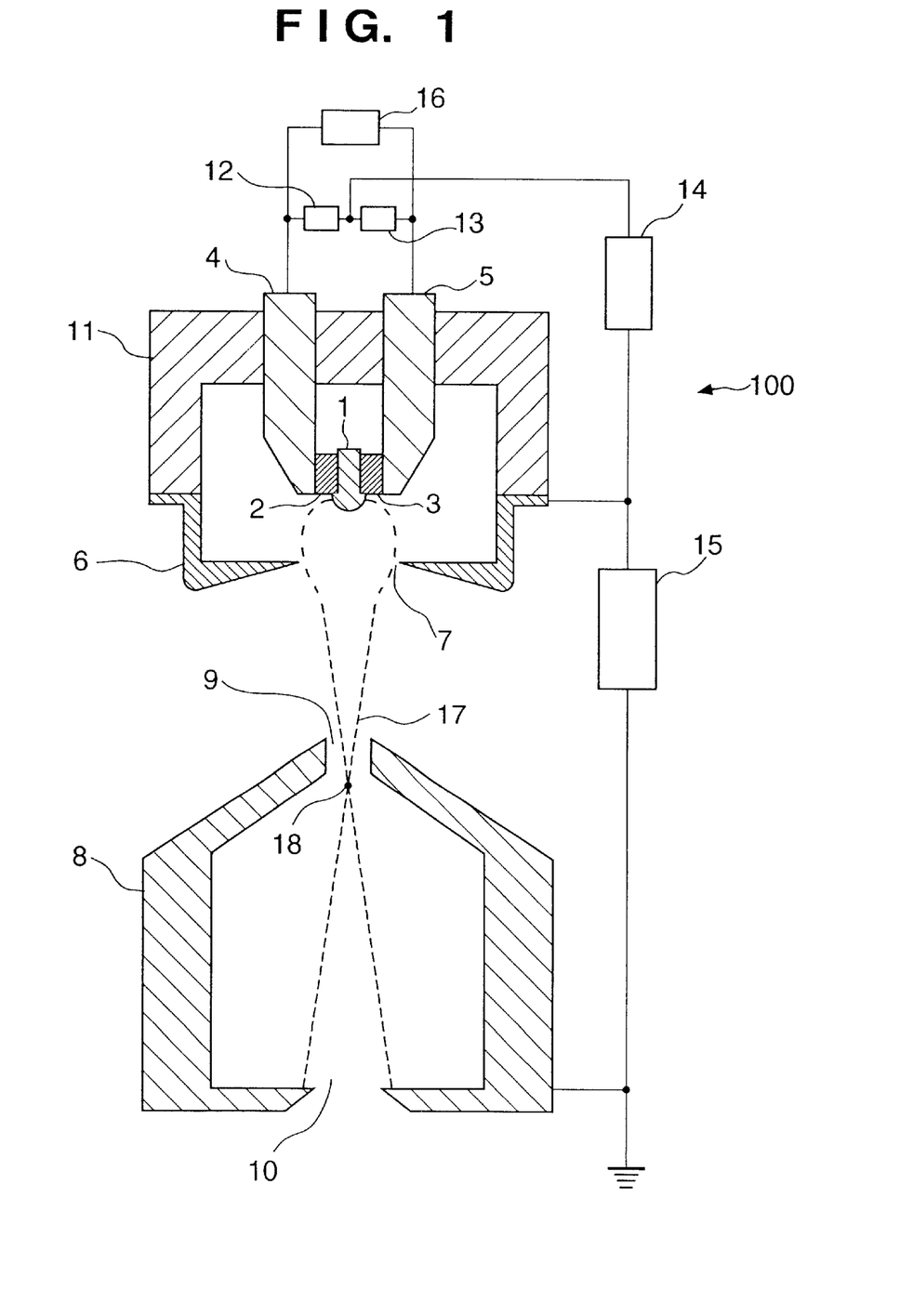
FIG. 1 is a sectional view showing the schematic structure of an electron gun according to the first embodiment of the present invention.

FIG. 1 is a sectional view showing the schematic structure of an electron gun 100 according to a preferred embodiment of the present invention. In FIG. 1, reference numeral 1 denotes a cathode for emitting electrons; 2 and 3, heaters for heating the cathode 1; 4 and 5, support electrodes which sandwich and fix the cathode 1 and the heaters 2 and 3, apply a voltage to the cathode 1, and flow a current through the heaters 2 and 3; 6, a bias electrode; 7, a second aperture defined by the bias electrode 6; 8, an anode for accelerating electrons emitted by the cathode 1 to apply a desired energy; 9, a first aperture defined by the upper portion of the anode 8; 10, a third aperture defined by the lower portion of the anode 8; 11, an insulator for insulating the support electrodes 4 and 5 and the bias electrode 6; 12, 13, and 14, bias circuits; 15, a high-voltage power supply for applying a voltage to the cathode 1 via the bias circuits 12, 13, and 14; and 16, a heating power supply for supplying a current to the heaters 2 and 3 to heat the cathode 1.

Note that the cathode 1, bias electrode 6, anode 8, and their apertures are formed coaxially using the optical axis of an electron beam as a central axis.

In FIG. 1, the cathode 1 emits electrons, and is made of a monocrystalline lanthanum hexaboride ($LaB_6$) column whose distal end is formed into a hemispherical shape. The side surface of the cathode 1 is notched flat so as to be symmetrical about the axis of the column. The notched portions of the cathode 1 are sandwiched by the graphite heaters 2 and 3, and further sandwiched by the support electrodes 4 and 5 from outside the heaters 2 and 3.

The cathode 1 receives a negative high potential from the high-voltage power supply 15 via the bias circuits 12, 13, and 14, and the high negative potential is 50 kV in the first embodiment. The bias electrode 6 receives a voltage lower by about 500 to 1,000 V than the potential applied to the cathode 1. By supplying a current from the heating power supply 16 to the heaters 2 and 3, the cathode 1 is heated to emit electrons.

The electron gun of the first embodiment operates in a region where the emission current is determined by space charges, i.e., a so-called space-charge limit region, by increasing the temperature of the cathode 1. An emitted electron beam 17 is accelerated by the anode 8. At the same time, the electron beam 17 converges by the electrostatic lens effect of the bias electrode 6 to form a crossover 18 through the first aperture 9 of the anode 8. The third aperture 10 of the anode 8 functions as a limit aperture which shields the marginal ray of the electron beam 17 and passes only a central ray having a flat current distribution.

Figure 2:
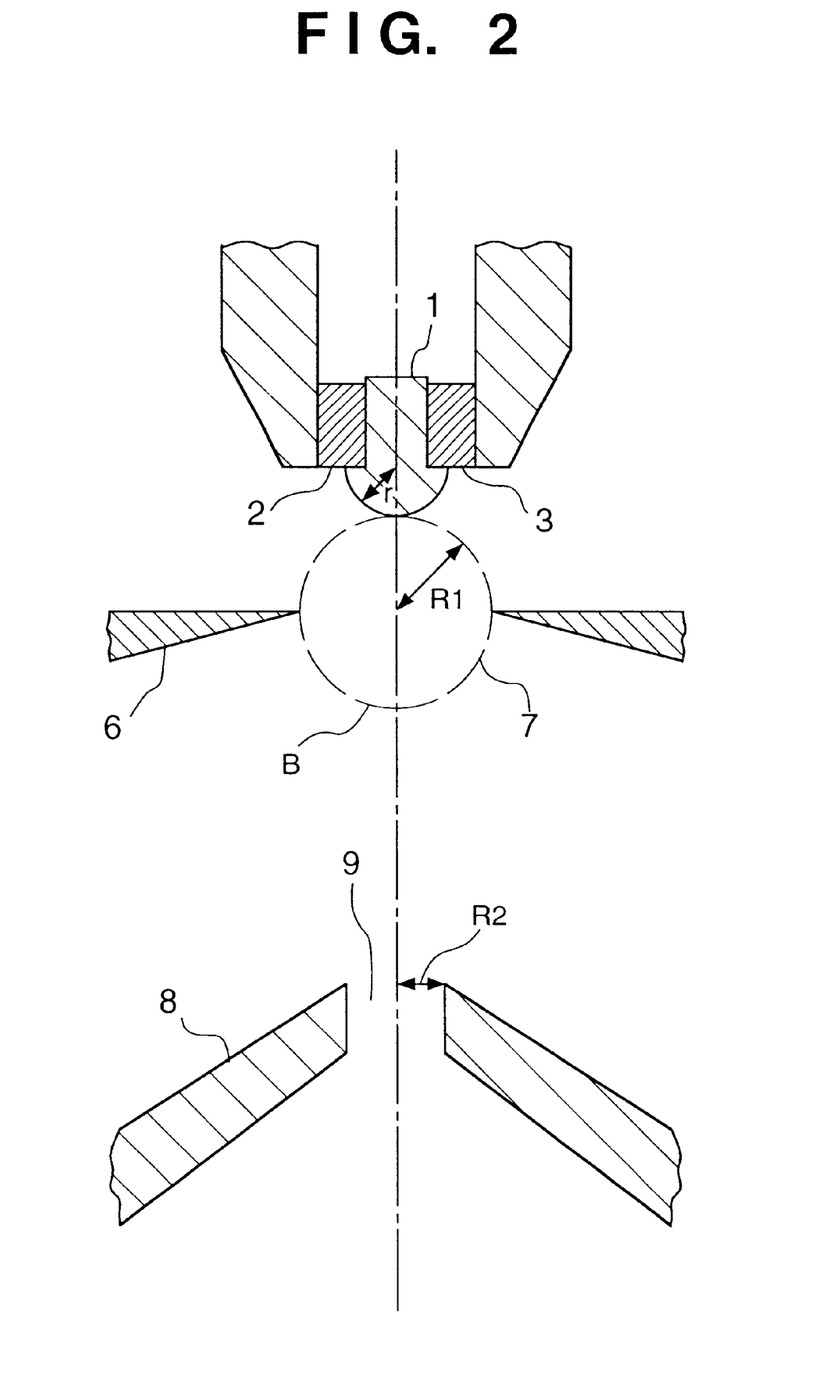
FIG. 2 is a sectional view showing the geometrical arrangement of the respective elements of the electron gun in the first embodiment.

FIG. 2 is a sectional view showing the geometrical arrangement of the respective elements of the cathode 1, bias electrode 6, and anode 8 in the electron gun 100 shown in FIG. 1. In FIG. 2, the second aperture 7 of the bias electrode 6 has a radius R1, and a virtual sphere B having this radius R1 is in contact with the radius vertex of a radius r of the electron-emitting surface of the cathode 1.

The radius r of the hemispherical electron-emitting surface and the radius R1 of the second aperture 7 of the bias electrode 6 have a relation of R1≧2r. Electrons emitted by almost the entire hemispherical electron-emitting surface efficiently pass through the second aperture 7 to contribute to formation of the crossover 18.

The first aperture 9 of the anode 8 has a radius R2, and the relation with the radius R1 of the second aperture 7 of the bias electrode 6 is R1≧R2. If a portion of the anode 8 facing the bias electrode 6 is perpendicular to the optical path of an electron beam, the distance between the bias electrode 6 and the anode 8 can be set large advantageously against abnormal discharge, but the flatness of the current distribution of the electron beam degrades slightly.

In the first embodiment, the portion of the anode 8 facing the bias electrode 6 projects toward the cathode 1. The angle vs. current distribution in this case is a distribution 102 in FIG. 5 in which the flatness is improved in comparison with the angle vs. current distribution 101 of the conventional electron gun. As the projection amount of the projecting anode 8 increases, the flatness of the angle vs. current distribution is further improved. The angle vs. current distribution becomes almost flat near the at a portion near the optical axis, similar to a distribution 103 in FIG. 5. The flatness abruptly decreases at peripheral portion which is apart from the optical axis by some distance.

This is because the lens effect by the electric field between the bias electrode 6 and the anode 8 is enhanced. This trend becomes more prominent as the diameter R2 of the first aperture 9 of the anode 8 decreases. To increase the projection amount of the projecting anode 8, the distance between the bias electrode 6 and the anode 8 must be shortened. This is because a larger projection amount of the projecting anode 8 weakens an electric field which concentrates on the hemispherical electron-emitting surface of the cathode 1 to cut off emitted electrons. Therefore, the distance between the bias electrode 6 and the anode 8 must be shortened for a larger projection amount of the projecting anode 8.

In this case, attention must be paid to discharge between the anode 8 and the bias electrode 6, and the fact that the crossover 18 is formed near the first aperture 9 of the anode 8 or nearer the cathode 1, the divergent angle of the electron beam 17 abruptly increases (e.g., about 200 mrad for the half angle of the beam), and the electron beam collides against the cathode-side surface of the anode 8.

The crossover diameter of the electron gun having the angle vs. current distributions 102 and 103 in FIG. 5 according to the present invention is 10 to 15 μm, and the emittance is about 250 to 450 μm·mrad. The luminance does not decrease to be lower than the order of $10^6$.

In the electron gun of FIG. 2, the distal end of the electron-emitting surface of the cathode 1 is in contact with the virtual sphere B, but may be outside the sphere B. In this case, the maximum emittance can be obtained when the distance between the distal end of the cathode 1 and the center of the sphere B is 1.1R1 to 1.2R1. In the first embodiment, the electron source is made of monocrystalline lanthanum hexaboride ($LaB_6$), but may be made of a refractory metal such as tungsten (W).

Second Embodiment

Figure 3:
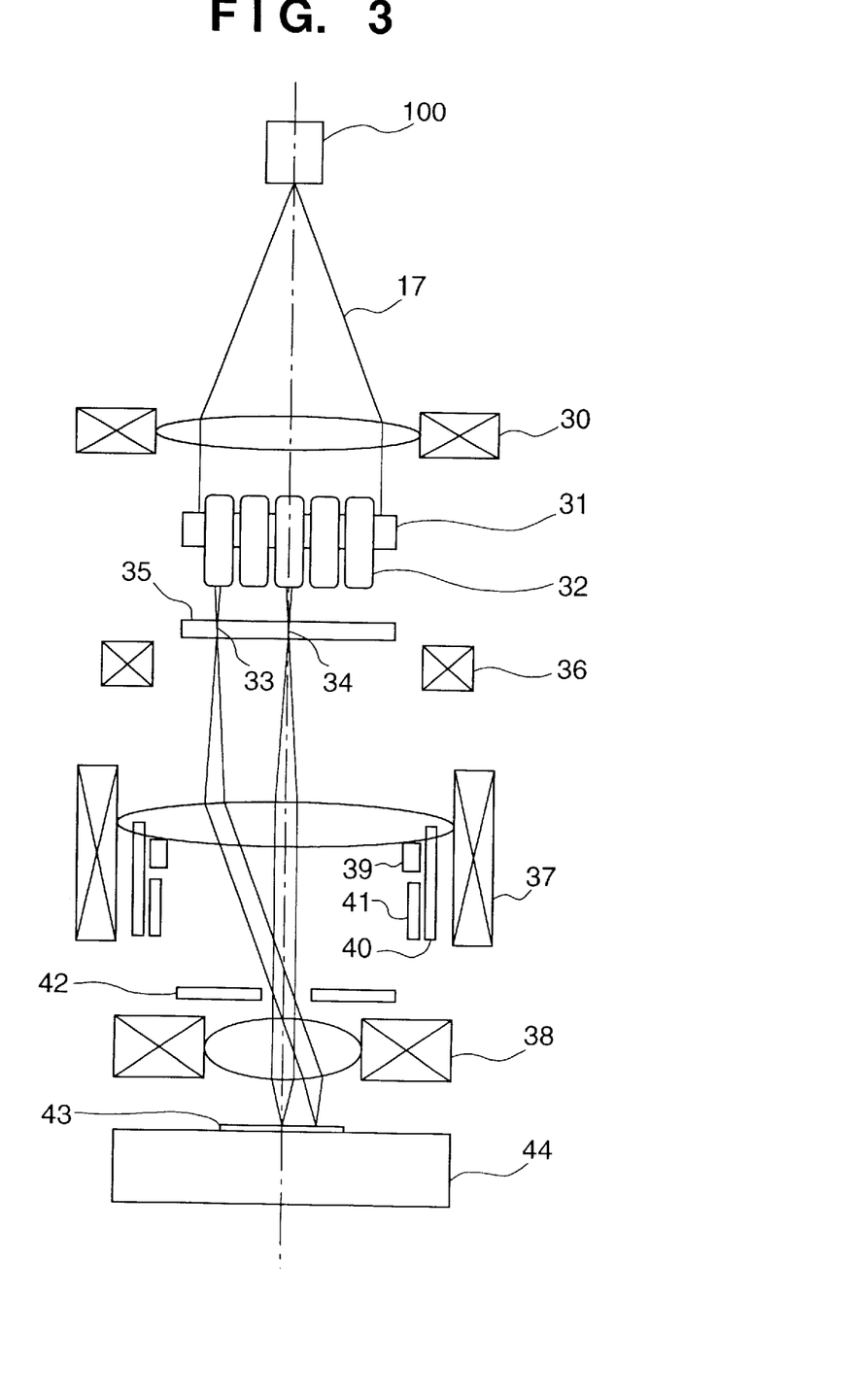
FIG. 3 is a sectional view showing the schematic structure of an electron beam drawing apparatus in the second embodiment using the electron gun of the first embodiment of the present invention.

An embodiment of an electron beam drawing apparatus using the electron gun 100 shown in FIG. 1 will be explained with reference to FIG. 3. FIG. 3 is a sectional view showing the schematic structure of an electron beam drawing apparatus for directly drawing a desired pattern on a sample using the electron gun of the present invention as a light source. In FIG. 3, reference numeral 100 denotes an electron gun according to the first embodiment of the present invention that serves as the light source of the drawing apparatus. An electron beam emitted by this light source is collimated into a substantially parallel electron beam by a condenser lens 30 whose front focal position is the light source position.

The substantially parallel electron beam is incident on a shaping system 31 on which a plurality of elementary electron optical systems 32 are laid out. The elementary electron optical systems 32 having blanking electrodes form intermediate images 33 and 34 of crossovers formed by the electron gun 100 near the aperture of a blanking aperture 35. At the same time, the plurality of blanking electrodes are individually operated to shield a plurality of electron beams by the blanking aperture 35.

Electromagnetic lenses 37 and 38 constitute a projection system using electromagnetic symmetrical doublets, and sandwich a limit aperture portion 42. The distance between the electromagnetic lenses 37 and 38 is equal to the sum of the focal lengths of the respective lenses. The intermediate images 33 and 34 of the light source are formed at the focal position of the electromagnetic lens 37, and images of the intermediate images are formed at the focal position of the electromagnetic lens 38. The ratio of the focal lengths of the electromagnetic lenses 37 and 38 is a projection magnification.

Since the magnetic fields of the electromagnetic lenses 37 and 38 are set to act in opposite directions, chromatic aberrations of rotation and magnification and Seidel's aberrations except for five, spherical aberration, astigmatism, coma, curvature of field, and on-axis chromatic aberration are canceled. Reference numeral 40 denotes an electromagnetic deflector which satisfies both the convergent magnetic field and MOL conditions; and 41, an electrostatic deflector for performing deflection by an electric field. Using the two deflectors, electron beams from the intermediate images 33 and 34 are deflected to two-dimensionally move images of these intermediate images on a sample 43.

The electromagnetic deflector 40 and electrostatic deflector 41 are selectively used depending on the moving distance of a light source image. Reference numeral 39 denotes a dynamic focus coil for correcting a shift of the focus position caused by a deflection error generated upon operating the deflector; 36, a dynamic sting coil for correcting astigmatism caused in the same operation; and 44, an X-Y-Z stage for moving the sample 43 in the X, Y, and Z directions. The position and moving speed of the X-Y-Z stage 44 are accurately controlled by a plurality of laser interferometers.

In actual drawing, the blanking electrodes of the elementary electron optical systems are operated based on pattern data to pass/shield a plurality of electron beams. The plurality of electron beams scan the sample 43 using the electromagnetic deflector 40 and electrostatic deflector 41, while the X-Y-Z stage 44 is moved interlockingly.

Note that this electron beam drawing apparatus is merely an example, and can adopt various arrangements within the spirit and scope of the present invention in order to draw a desired pattern over a wide field of view.

In the second embodiment, the electron gun according to the preferred embodiment of the present invention is applied to an electron beam drawing apparatus. When irradiation of an electron beam at high luminance, high emittance, or in a wide field of view is demanded, the electron gun can also be applied to the other type of apparatus utilizing a plurality of electron beams generated by splitting one electron beams.

Third Embodiment

A device manufacturing method using the above electron beam drawing apparatus will be described with reference to FIGS. 6 and 7.

Figure 6:
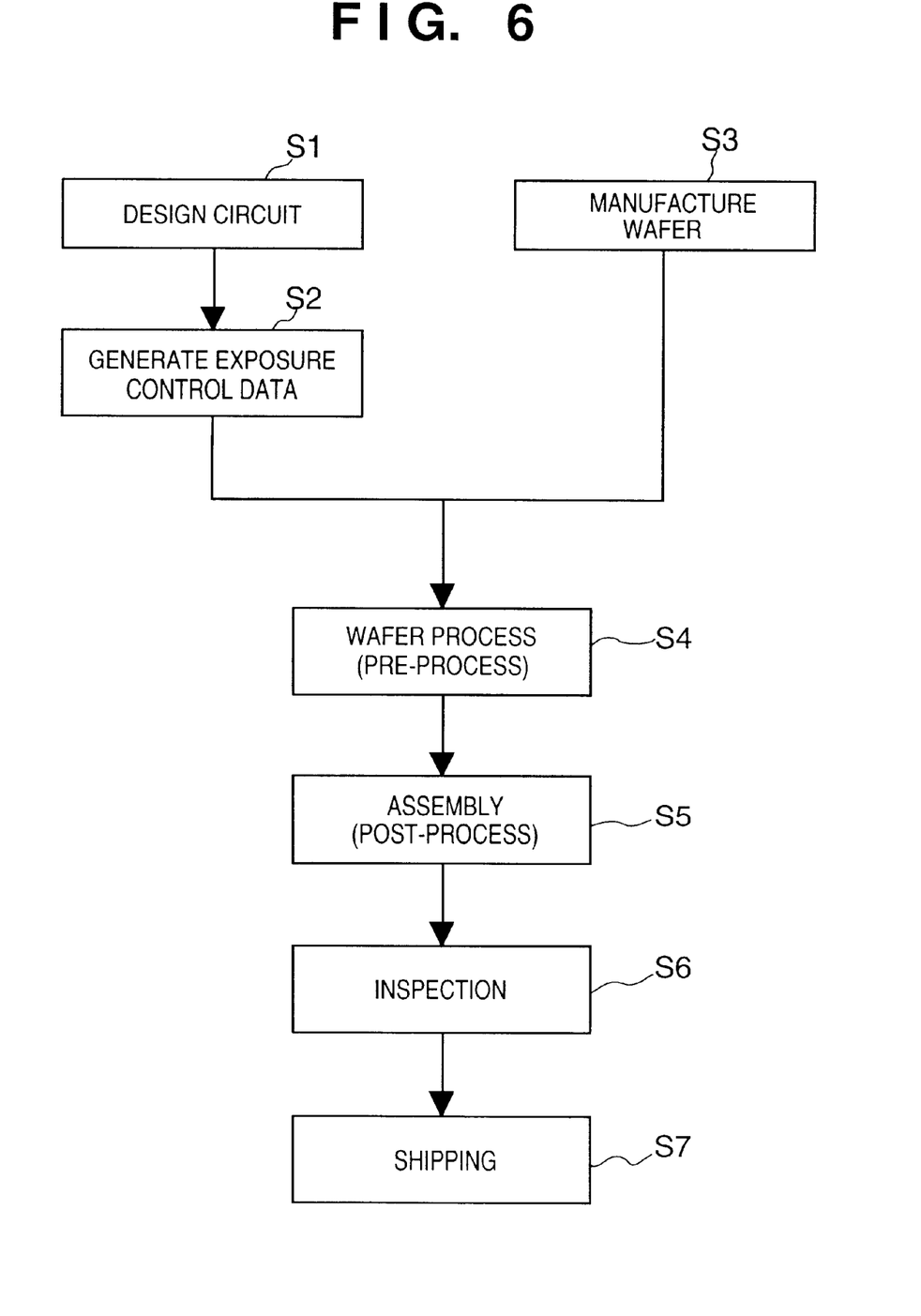
FIG. 6 is a flow chart showing a microdevice manufacturing method according to the third embodiment of the present invention.

FIG. 6 shows the manufacturing flow of a microdevice (semiconductor chip such as an IC or LSI, liquid crystal panel, CCD, thin-film magnetic head, micromachine, or the like).

In step 1 (S1: circuit design), a semiconductor device circuit is designed. In step 2 (S2: generation of exposure control data), exposure control data of the exposure apparatus is created based on the designed circuit pattern. In step 3 (S3: wafer manufacture), a wafer is manufactured using a material such as silicon.

In step 4 (S4: wafer process) called a pre-process, an actual circuit is formed on the wafer by lithography using the wafer and the exposure apparatus which receives the prepared exposure control data. Step 5 (S5: assembly) called a post-process is the step of forming a semiconductor chip using the wafer manufactured in step 4, and includes an assembly process (dicing and bonding), packaging process (chip encapsulation), and the like.

In step 6 (S6: inspection), inspections such as the operation confirmation test and durability test of the semiconductor device manufactured in step 5 are conducted. After these steps, the semiconductor device is completed and shipped in step 7 (S7: shipping).

Figure 7:
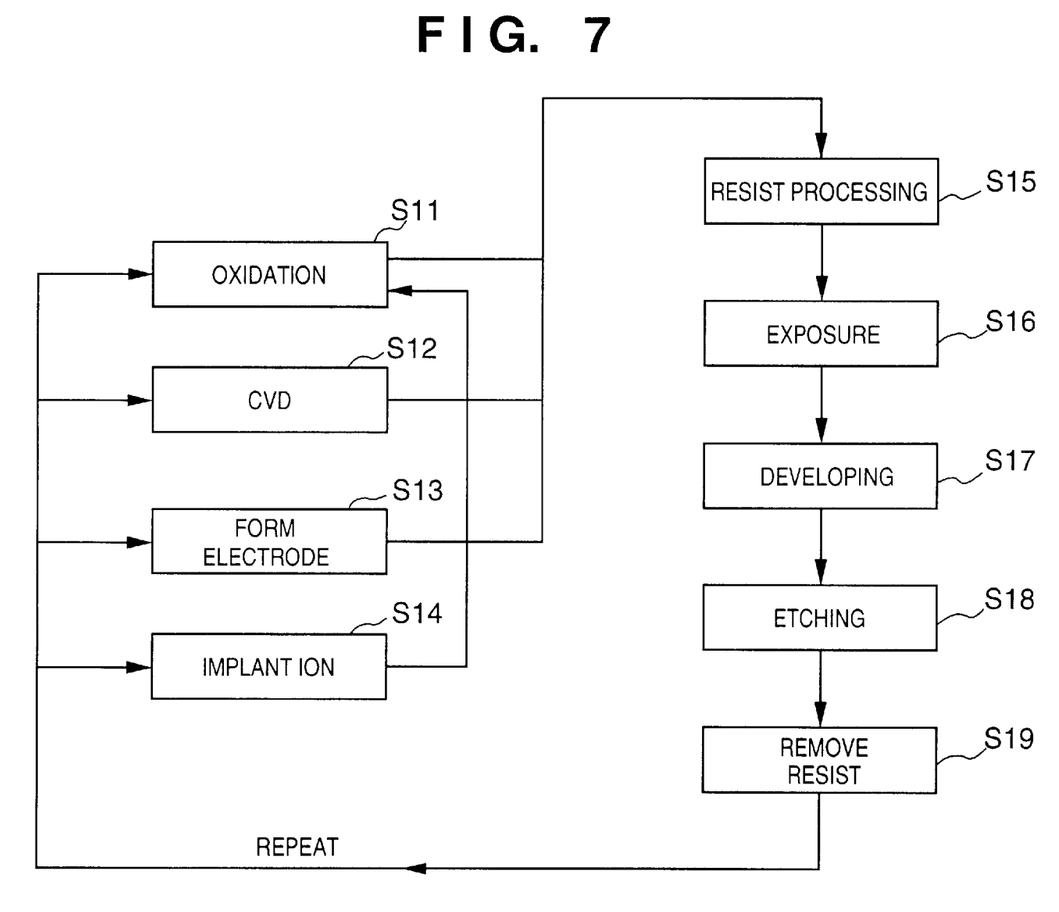
FIG. 7 is a flow chart showing the microdevice manufacturing method according to the third embodiment of the present invention.

FIG. 7 shows a detailed manufacturing flow of this wafer process.

In step 11 (S11: oxidation), the wafer surface is oxidized. In step 12 (S12: CVD), an insulating film is formed on the wafer surface. Instep 13 (S13: electrode formation), an electrode is formed on the wafer by deposition. In step 14 (S14: ion implantation), ions are implanted into the wafer. In step 15 (S15: resist processing), a photosensitive agent is applied to the wafer.

In step 16 (S16: exposure), the above-described exposure apparatus exposes the wafer to a circuit pattern. In step 17 (S17: developing), the exposed wafer is developed. In step 18 (S18: etching), the resist is etched except for the developed resist image. In step 19 (S19: resist removal), an unnecessary resist after etching is removed.

These steps are repeated to form multiple circuit patterns on the wafer. The manufacturing method of the third embodiment can manufacture a highly integrated semiconductor, which is difficult to manufacture in the prior art.

The electron gun and the electron beam drawing apparatus using the same according to the present invention attain, e.g., the following remarkable effects.

(1) The electron-emitting surface of the cathode is formed into a hemispherical shape, and the vertex of the hemisphere is arranged on or outside the virtual sphere whose diameter is equal to the diameter of the aperture of the bias electrode. While the luminance is kept relatively high, an electron beam having a flat angle vs. current distribution and a uniform intensity distribution over a wide field of view can be emitted.

(2) The diameter of the aperture of the anode is set smaller than that of the aperture of the bias electrode, and a portion of the anode facing the bias electrode projects toward the bias electrode. This can make the angle vs. current distribution flatter, thereby increasing the emittance.

(3) The electron beam drawing apparatus using the electron gun of the present invention draws a pattern by simultaneously irradiating a sample with a plurality of electron beams associated with a plurality of intermediate images formed in a wide field of view. As a result, the apparatus can draw a desired pattern at high throughput.

The present invention is not limited to the above embodiments and various changes and modifications can be made within the spirit and scope of the present invention. Therefore, to apprise the public of the scope of the present invention the following claims are made.

What is claimed is:

1. An electron gun comprising:
   a cathode with a partially spherical electron-emitting surface;
   an anode, which is arranged to face said cathode, and which includes a first aperture; and
   a bias electrode, which is arranged between said anode and said cathode, and which includes a second aperture having a radius larger than a radius of the electron-emitting surface of said cathode,
   wherein said electron-emitting surface of said cathode is arranged to be in contact with or outside of a virtual sphere whose diameter is equal to a diameter of the second aperture of said bias electrode, and
   wherein a center of the virtual sphere accords with that of the second aperture.

2. The gun according to claim 1, wherein a distance between the surface of said cathode and the center of the virtual sphere is 1.1 to 1.2 times a radius of the virtual sphere.

3. The gun according to claim 1, wherein the radius of the second aperture of said bias electrode is not less than twice a radius of the electron-emitting surface of said cathode.

4. The gun according to claim 1, wherein a radius of the first aperture of said anode is smaller than the radius of second aperture of said bias electrode.

5. The gun according to claim 4, wherein a portion of said anode facing said bias electrode projects toward the electron-emitting surface of said cathode.

6. The gun according to claim 1, wherein the distance between the surface of said cathode and the center of the virtual sphere is not more than 1.2 times the radius of the virtual sphere.

7. An electron beam drawing apparatus comprising an electron gun, a substrate stage, and a projection system arranged between said electron gun and said substrate stage, wherein said electron gun includes:
   a cathode with a partially spherical electron-emitting surface;
   an anode, which is arranged to face the cathode, and which includes a first aperture; and
   a bias electrode, which is arranged between said anode and said cathode, and which includes a second aperture having a radius larger than a radius of the electron-emitting surface of the cathode,
   wherein the electron-emitting surface of the cathode is arranged to be in contact with or outside of a virtual sphere whose diameter is equal to the diameter of the second aperture of the bias electrode, and wherein a center of the virtual sphere accords with that of the second aperture.

8. The apparatus according to claim 7, wherein a distance between the surface of the cathode and the center of the virtual sphere is 1.1 to 1.2 times a radius of the virtual sphere.

9. The apparatus according to claim 7, wherein the radius of the second aperture of the bias electrode is not less than twice a radius of the electron-emitting surface of the cathode.

10. The apparatus according to claim 7, wherein a radius of the first aperture of the anode is smaller than the radius of the second aperture of the bias electrode.

11. The apparatus according to claim 10, wherein a portion of the anode facing the bias electrode projects toward the electron-emitting surface of the cathode.

12. The apparatus according to claim 7, further comprising an elementary electron optical system, adapted to form a plurality of intermediate images of a crossover formed by said electron gun, wherein said apparatus draws a pattern on a substrate with a plurality of electron beams corresponding to the plurality of intermediate images through said projection system.

13. A device manufacturing method comprising the steps of:

applying a photosensitive agent to a substrate;

drawing a pattern on the substrate using an electron beam drawing apparatus; and performing a developing process on the substrate, wherein the electron beam drawing apparatus comprises an electron gun, a substrate stage, and a projection system arranged between the electron gun and the substrate stage, wherein the electron gun includes:
 a cathode with a partially spherical electron-emitting surface;
 an anode, which is arranged to face the cathode, and which includes a first aperture; and
 a bias electrode, which is arranged between the anode and the cathode, and which includes a second aperture having a radius larger than a radius of the electron-emitting surface of the cathode, wherein the electron-emitting surface of the cathode is arranged to be in contact with or outside of a virtual sphere whose diameter is equal to a diameter of the second aperture of the bias electrode, and wherein a center of the virtual sphere accords with that of the second aperture.

14. An electron gun comprising:
 a cathode with a partially spherical electron-emitting surface;
 an anode, which is arranged to face said cathode; and
 a bias electrode, which is arranged between said anode and said cathode, and which includes an aperture,
 wherein a distance between the electron-emitting surface and a center of the aperture is not less than a distance between the center of the aperture and an edge of the aperture.

15. The gun according to claim 14, wherein the distance between the electron-emitting surface and the center of the aperture is not more than 1.2 times the distance between the center of the aperture and the edge of the aperture.

16. An electron beam drawing apparatus comprising an electron gun, a substrate stage, and a projection system arranged between said electron gun and said substrate stage, wherein said electron gun includes:
 a cathode with a partially spherical electron-emitting surface;
 an anode, which is arranged to face the cathode; and
 a bias electrode, which is arranged between the anode and the cathode, and which includes an aperture,
 wherein a distance between the electron-emitting surface and a center of the aperture is not less than a distance between the center of the aperture and an edge of the aperture.

17. A device manufacturing method comprising the steps of:

applying a photosensitive agent to a substrate;

drawing a pattern on the substrate using an electron beam drawing apparatus; and performing a developing process on the substrate;

wherein the electron beam drawing apparatus comprises an electron gun, a substrate stage, and a projection system arranged between the electron gun and the substrate stage, wherein the electron gun includes:
 a cathode with a partially spherical electron-emitting surface;
 an anode, which is arranged to face the cathode; and
 a bias electrode, which is arranged between the anode and the cathode, and which includes an aperture, and
 wherein a distance between the electron-emitting surface and a center of the aperture is not less than a distance between the center of the aperture and an edge of the aperture.

* * * * *